United States Patent
Fukuda

(10) Patent No.: US 10,290,834 B2
(45) Date of Patent: May 14, 2019

(54) ORGANIC ELECTROLUMINESCENCE DISPLAY DEVICE AND MANUFACTURING METHOD THEREOF

(71) Applicant: Japan Display Inc., Minato-ku (JP)

(72) Inventor: Kaichi Fukuda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/452,129

(22) Filed: Mar. 7, 2017

(65) Prior Publication Data
US 2017/0279086 A1    Sep. 28, 2017

(30) Foreign Application Priority Data

Mar. 23, 2016    (JP) ................... 2016-058830

(51) Int. Cl.
| | |
|---|---|
| *H01L 51/56* | (2006.01) |
| *H01L 27/32* | (2006.01) |
| *H01L 51/00* | (2006.01) |
| *H01L 51/50* | (2006.01) |
| *H01L 51/52* | (2006.01) |

(52) U.S. Cl.
CPC .......... *H01L 51/56* (2013.01); *H01L 27/3246* (2013.01); *H01L 51/001* (2013.01); *H01L 51/0012* (2013.01); *H01L 51/0021* (2013.01); *H01L 51/5012* (2013.01); *H01L 51/5206* (2013.01); *H01L 2251/5392* (2013.01)

(58) Field of Classification Search
CPC . H01L 51/5253; H01L 51/5246; H01L 51/56; H01L 2251/5338

USPC ....... 257/40, 79, E51.022; 438/149, 151, 28, 438/34, 46
See application file for complete search history.

(56) References Cited

U.S. PATENT DOCUMENTS

| | | | | |
|---|---|---|---|---|
| 2003/0146692 | A1* | 8/2003 | Uchida | ............... H01L 51/0005 313/504 |
| 2005/0031902 | A1* | 2/2005 | Uchida | ............... H01L 27/3211 428/690 |
| 2005/0057148 | A1* | 3/2005 | Seki | .................... H01L 27/3211 313/504 |
| 2013/0119358 | A1* | 5/2013 | Sasaki | ................... H01L 51/529 257/40 |
| 2014/0014909 | A1* | 1/2014 | Lee | ..................... H01L 51/5088 257/40 |
| 2014/0225089 | A1 | 8/2014 | Kato et al. | |

(Continued)

FOREIGN PATENT DOCUMENTS

| | | |
|---|---|---|
| JP | 2014-154450 | 8/2014 |
| JP | 2015-109192 | 6/2015 |
| WO | WO2013/190841 | 12/2013 |

*Primary Examiner* — Jonathan Han
(74) *Attorney, Agent, or Firm* — Oblon, McClelland, Maier & Neustadt, L.L.P.

(57) ABSTRACT

An organic EL display device includes a pixel electrode, a pixel isolation insulating film on which an opening at a bottom of which the pixel electrode is exposed is formed, an aggregate of an organic material partially formed on the pixel electrode that is exposed at the bottom of the opening, an organic film, including a light emitting layer, that covers the pixel electrode and the aggregate, and an opposing electrode that covers the organic film. The aggregate is formed at a corner formed by the pixel electrode that is exposed at the bottom of the opening and an inner wall that forms the opening of the pixel isolation insulating film.

3 Claims, 6 Drawing Sheets

(56) References Cited

U.S. PATENT DOCUMENTS

| | | |
|---|---|---|
| 2015/0155523 A1 | 6/2015 | Kamiya |
| 2015/0221709 A1 | 8/2015 | Shimamura et al. |
| 2015/0340654 A1 | 11/2015 | Kato et al. |
| 2016/0285040 A1 | 9/2016 | Kamiya |
| 2016/0293685 A1 | 10/2016 | Kato et al. |
| 2016/0293890 A1 | 10/2016 | Kato et al. |
| 2016/0301033 A1 | 10/2016 | Kato et al. |

\* cited by examiner

US 10,290,834 B2

ORGANIC ELECTROLUMINESCENCE DISPLAY DEVICE AND MANUFACTURING METHOD THEREOF

CROSS-REFERENCE TO RELATED APPLICATION

The present application claims priority from Japanese application JP2016-058830 filed on Mar. 23, 2016, the content of which is hereby incorporated by reference into this application.

BACKGROUND OF THE INVENTION

1. Field of the Invention

The present invention relates to an organic EL display device and a manufacturing method thereof.

2. Description of the Related Art

It may be configured that in an organic EL display device an opening that exposes a pixel electrode is formed on an insulating film covering a pixel electrode, an organic film including a light emitting layer on the pixel electrode inside the opening is formed, and further an opposing electrode is formed on the organic film (see Japanese Unexamined Patent Application Publication No. 2015-109192).

SUMMARY OF THE INVENTION

Whereas, since the organic film including a light emitting layer is thin compared with the insulating layer, it may be broken inside the opening formed on the insulating film. If the opposing electrode is formed on the organic film in a condition where the organic film is broken, the pixel electrode and the opposing electrode could be short-circuited which results in a pixel defect.

The present invention has been made in view of the above problems, and an object of the present invention is to provide an organic EL display device capable of improving yield and a manufacturing method thereof.

An organic EL display device includes a pixel electrode, a pixel isolation insulating film on which an opening at a bottom of which the pixel electrode is exposed is formed, an aggregate of an organic material partially formed on the pixel electrode that is exposed at the bottom of the opening, an organic film, including a light emitting layer, that covers the pixel electrode and the aggregate, and an opposing electrode that covers the organic film. The aggregate is formed at a corner formed by the pixel electrode that is exposed at the bottom of the opening and an inner wall that forms the opening of the pixel isolation insulating film.

DETAILED DESCRIPTION OF THE INVENTION

Figure 1:
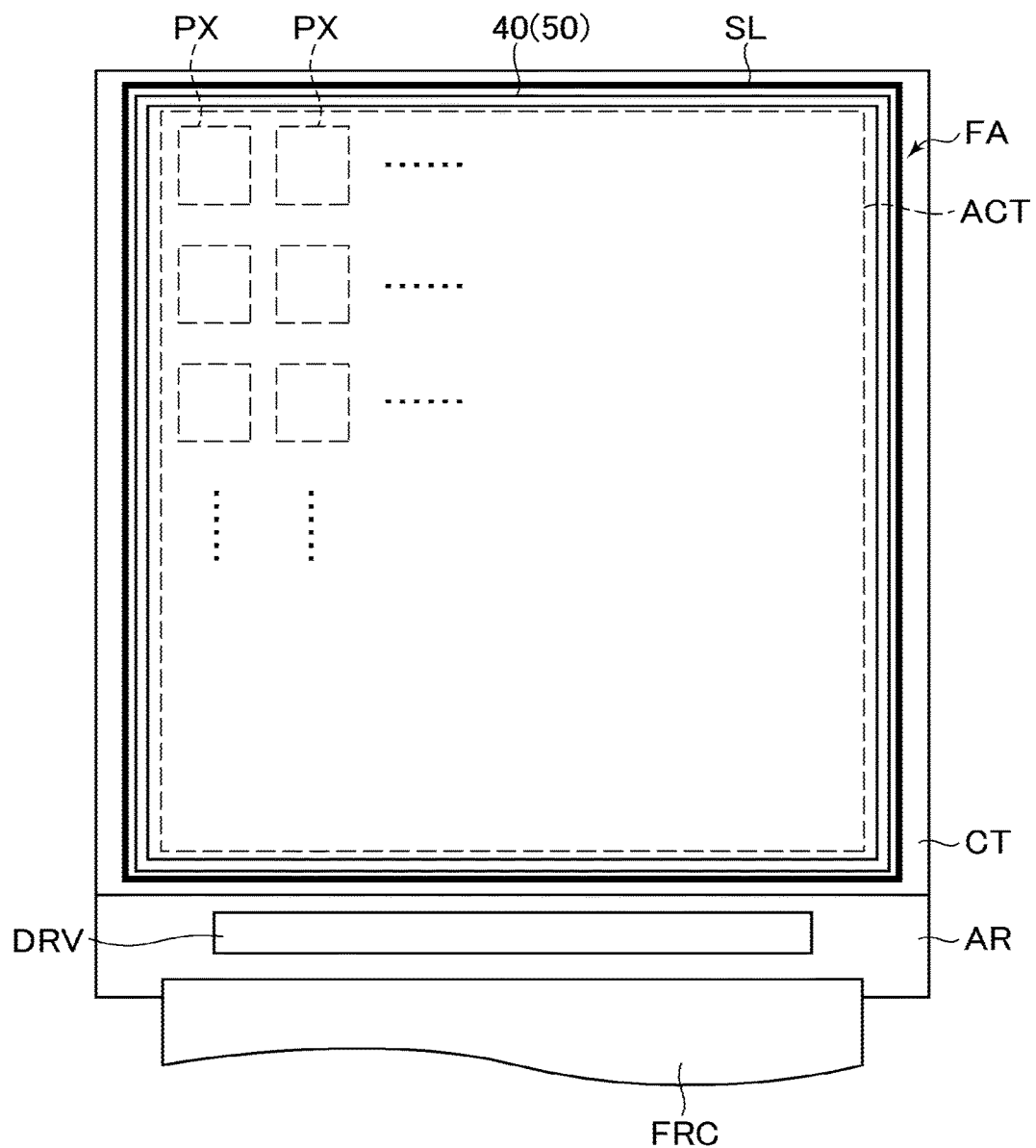
FIG. 1 is a view schematically illustrating an organic EL display device according to an embodiment of the present invention.

Below, each embodiment of the present invention is explained with reference to the drawings. Note that disclosed embodiments are merely examples, and appropriate variations within the spirit of the present invention that can be easily arrived at by those skilled in the art should be duly included in the scope of the present invention. Further, while the width, thickness, shape, and the like of each component in the drawings may be illustrated schematically as compared with the actual embodiments in order to clarify the explanation, these are merely examples and the interpretation of the present invention should not be limited thereto. Furthermore, in the specification and respective drawings, the same reference symbols may be applied to elements that have already been illustrated in another drawing and a detailed explanation of such elements may be omitted as appropriate.

FIG. 1 is a view schematically illustrating an organic EL display device according to an embodiment of the present invention. The organic EL display device of the present invention is provided with an active area ACT including pixels PX disposed in a matrix arrangement, a frame area FA located outside thereof, an array substrate AR, an opposing substrate CT, a driving circuit DRV, and a flexible substrate FRC.

The array substrate AR and the opposing substrate CT are disposed in opposition to each other, and are fixed with a sealing member SL disposed so as to surround the active area ACT.

In an area of the array substrate AR that is extended from an edge of the opposing substrate CT, the driving circuit DRV that drives a plurality of pixels PX is disposed. The driving circuit DRV outputs, in accordance with a control signal and an image signal input from the outside via the flexible substrate FRC connected to an edge of the array substrate AR, the control signal and the image signal to a source wire and a gate wire that are not illustrated.

Figure 2:
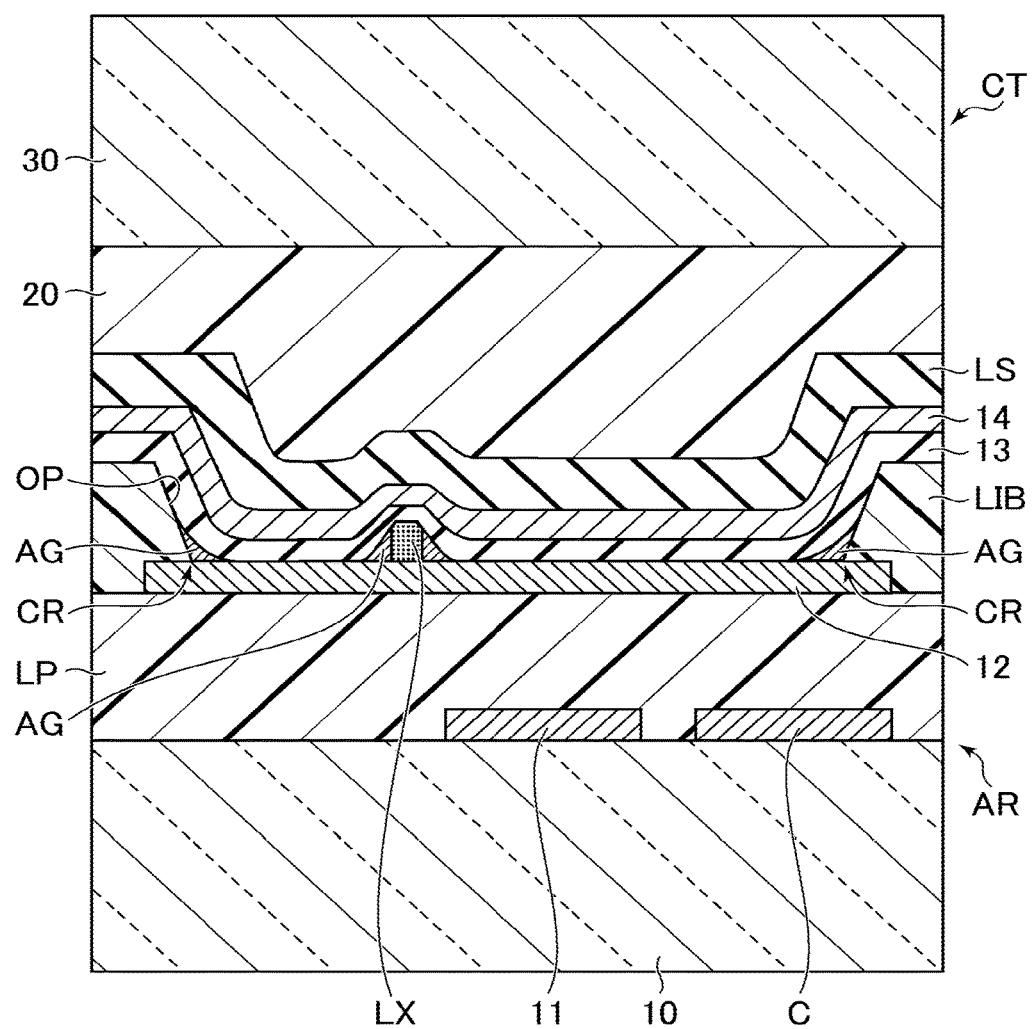
FIG. 2 is a cross sectional view schematically illustrating a structure of a pixel of the organic EL display device.

FIG. 2 is a cross sectional view schematically illustrating a structure of a pixel of the organic EL display device illustrated in FIG. 1.

The array substrate AR is provided with a supporting substrate 10, a switching element 11, an auxiliary capacitance capacitor C, an anode (a pixel electrode) 12, an organic layer 13 including a light emitting layer, a cathode (an opposing electrode) 14, and a sealing film LS.

The supporting substrate 10 is a transparent insulating substrate formed with glass or the like, and is a member on an upper surface of which the switching element 11, the auxiliary capacitance capacitor C, the anode 12, the organic layer 13, the cathode 14 to be described later, and the like are formed.

The switching element 11 is provided with a thin film transistor formed with a plurality of conductive layers and insulating layers formed on the supporting substrate 10. That is, the switching element is formed simultaneously with various kinds of wires such as the source wire and the gate wire that are not illustrated.

The auxiliary capacitance capacitor C is formed with the plurality of conductive layers and insulating layers formed on the supporting substrate 10. The auxiliary capacitance is coupled to a pixel capacitance formed between the anode 12 and the cathode 14.

A passivation film LP is formed so as to cover the switching element 11 and the auxiliary capacitance capacitor C. By disposing the passivation film LP on switching elements 11 and the auxiliary capacitance capacitor C, neighboring conductors from among the switching elements 11 and the auxiliary capacitance capacitor C are electrically insulated from one another, and the switching elements 11 and the cathode 12 are electrically insulated from one another. On the passivation film LP, a contact hole (not illustrated) to electrically connect the switching element 11 and the anode 12 is formed in each pixel PX. The passivation film LP is formed with a material that is insulating such as SiO2, SiN, acryl, polyimide, or the like, and planarizes unevenness on a surface of the switching element 11 and an auxiliary capacitance capacitor C.

The anode 12 is disposed on the passivation film LP in each pixel PX. The anode 12 is arranged to reflect light emitted by the organic layer 13 to the side of the cathode 14. For example, the anode 12 is provided with a reflection layer disposed on the passivation film LP and a transparent electrode disposed on the reflection layer.

The reflection layer of the anode 12 may be disposed in each pixel PX, and may be shared by a plurality of pixels PX. The reflection layer having a higher light reflectivity is more preferable, and a metal film made of, for example, aluminum, silver (Ag), or the like can be used.

The transparent electrode of the anode 12 is electrically connected to the switching element 11 at the contact hole (not illustrated) provided on the passivation film LP. A driving current is supplied to the transparent electrode of the anode 12 via the switching element 11 from the driving circuit DRV.

The transparent electrode of the anode 12 is made of a material that is light transmitting and conducting. The transparent electrode of the anode 12 can be formed with a material that is light transmitting and conducting such as ITO (indium tin oxide) and IZO (indium zinc oxide).

A rib layer (pixel isolation insulating film) LIB covers the passivation film LP and the anode 12. An opening OP at the bottom of which the cathode 12 is exposed is formed on the rib layer LIB. In other words, the rib layer LIB is disposed between neighboring anodes 12. The opening OP is formed so as to be included in the anode 12 in a planar view, and a part that does not include a peripheral part of the anode 12 and is located inwardly therefrom is exposed. An inner wall that forms the opening OP of the rib layer LIB covers the peripheral part of the anode 12, and is in a tapered shape. The rib layer LIB prevents neighboring anodes 12 from contacting with each other. The rib layer LIB covers an outer perimeter of the anode 12 formed, for example, along a border between pixels PX. A height of the rib layer LIB is around 2000 nm. The rib layer LIB is formed with a material that is insulating, and can be formed with, for example, a light-sensitive resin material.

The organic layer 13 is disposed on the anode 12 that is exposed at the bottom of the opening OP of the rib layer LIB. The organic layer 13 has a light emitting layer that emits light, and the emitted light can be white or other colors. The organic layer 13 is formed so as to cover the whole of an area on which the pixels PX are disposed of the active area ACT. However, the configuration is not limited thereto and the active area ACT may be formed for each pixel PX.

The organic layer 13 is formed by laminating, for example, a hole injection layer, a hole transport layer, a light emitting layer, an electron transport layer, and an electron injection layer (not illustrated) in order from the side of the anode 12. Note that the lamination structure of the organic layer 13 is not limited to the one mentioned here. It is sufficient if it at least includes the light emitting layer, and its lamination structure is not specified in particular.

The light emitting layer is composed of, for example, an organic electroluminescence (EL) material that emits light through a recombination of a hole and an electron caused by the driving current supplied via the anode 12. As such an organic electroluminescence material, for example, something that is generally used as an organic light emitting material can be used, and specifically, for example, a known fluorescent low-molecular material that can be luminescent from a singlet state and a known phosphorescent low-molecular material that can be luminescent from a rare-earth metal complex-based triplet state, such as a coumarin-based material, a perylene-based material, a pyran-based material, an anthrone-based material, a porphyrin-based material, a quinacridone-based material, an N,N'-dialkyl-substituted quinacridone-based material, a naphthalimide-based material, or an N,N'-diaryl-substituted pyrrolo-pyrrole-based material can be used.

The cathode 14 is disposed on the organic layer 13. The cathode 14 is shared by a plurality of pixels PX. That is, the cathode 14 is disposed over the plurality of pixels PX, and is formed so as to cover, for example, the whole of the area on which the pixels PX are disposed of the active area ACT.

The cathode 14 is formed with an electrode material that is transparent. The cathode 14 can be formed with, specifically, for example, a material that is light transmitting and conducting such as ITO or IZO.

The anode 12, the organic layer 13, and the cathode 14 are organic EL light emitting elements that function as a light emitting source.

The sealing film LS is disposed on the cathode 14 The sealing film LS is, for example, a barrier film made of silicon nitride (SiN), or has a multi-layered structure where a barrier film and a polymer resin composed of acrylic resin, epoxy resin, polyimide resin, and the like are laminated.

An upper surface of the sealing film LS is covered by the opposing substrate CT, for example, with an interposition of a filler 20. The opposing substrate CT has an insulating substrate 30 that is transparent, such as glass, and has an outer perimeter smaller than the supporting substrate 10.

In the organic EL display device of this embodiment, a planarizing layer AG is formed inside the opening OP formed on the rib layer LIB. The planarizing layer AG is an aggregate of an organic material, and is formed partially or intermittently on the anode 12 that is exposed at the bottom of the opening OP.

Specifically, the planarizing layer AG is formed so as to fill in a corner formed at the bottom of the opening OP. In other words, the planarizing layer AG is selectively disposed so as to be centered around an intersection of a horizontal surface and an inclined surface that is generated due to an arrangement of the lower layers, and makes the inclination around the intersection of the horizontal surface and the inclined surface moderate. By providing the planarizing layer AG, the inclination of the surface on which the organic layer 13 is disposed becomes moderate. As a result thereof, the organic layer 13 can be hardly broken or thinned, which prevents the anode 12 and the cathode 14 from being short-circuited.

For example, inside the opening OP, a corner CR is formed by the anode 12 being exposed at the bottom of the opening OP and the inner wall forming the opening OP. The planarizing layer AG is formed at this corner CR, and has an upper surface that is inclined more moderately than the inner wall that forms the opening OP. In other words, the planarizing layer AG is formed near the intersection of the inclined surface of the rib layer LIB and the horizontal surface of the anode 12. The corner CR is a little larger than the right angle, and the inner wall that forms the opening OP is an inclined surface that is in a tapered shape spreading outward. The upper surface of the planarizing layer AG formed at the corner CR is inclined more moderately than the inner wall that forms the opening OP.

Further, for example, to the anode 12 that is exposed at the bottom of the opening OP, a foreign object (a particle) LX that is generated during the manufacturing process may be attached. The planarizing layer AG is formed also at a corner formed by the anode 12 that is exposed at the bottom of the opening OP and the foreign object LX that exists on the anode 12. That is, the planarizing layer AG is formed so as to surround the foreign object LX, and has an upper surface that is inclined more moderately than a lateral side of the foreign object LX around the foreign object LX. In other words, the planarizing layer AG is formed near the intersection of the horizontal surface of the anode 12 and a lateral surface of the foreign object LX.

As seen above, since the planarizing layer AG forms a moderate inclination by filling in a corner formed at the bottom of the opening OP, when forming the organic film 13 inside the opening OP, the organic film 13 can be formed continuously without being broken or thinned. It is preferable that the inclined surface created on the surface of the planarizing layer AG on the anode 12 and the surface of the anode 12 form an angle that is smaller than a predetermined angle, so that the organic layer 13 is not broken or thinned.

An organic material is preferable as a material of the planarizing layer AG, and specifically, a polymer organic material that is cured through a polymerization reaction including acrylic resin, epoxy resin, polyimide resin, or the like can be used.

The planarizing layer AG is formed, for example, by spraying solvent including an organic material to be cured. At this time, the solvent sprayed onto the surface of the anode 12, a side wall that forms the opening OP, and the like is aggregated by a surface tension. The solvent aggregates, in particular, around the corner CR formed by the inner wall that forms the opening OP and the anode 12 and around the foreign object LX, and the solvent aggregated this way is cured to be the planarizing layer AG.

It is preferable that the planarizing layer AG makes the inclination of the inclined surface generated on the anode 12 more moderate, and is disposed intermittently. Accordingly, in the case where the planarizing layer AG is continuously formed, it is preferable to make it intermittent by removing a film part of the planarizing layer AG by etching. A detail of a formation of the planarizing layer AG will be described later.

Figure 3:
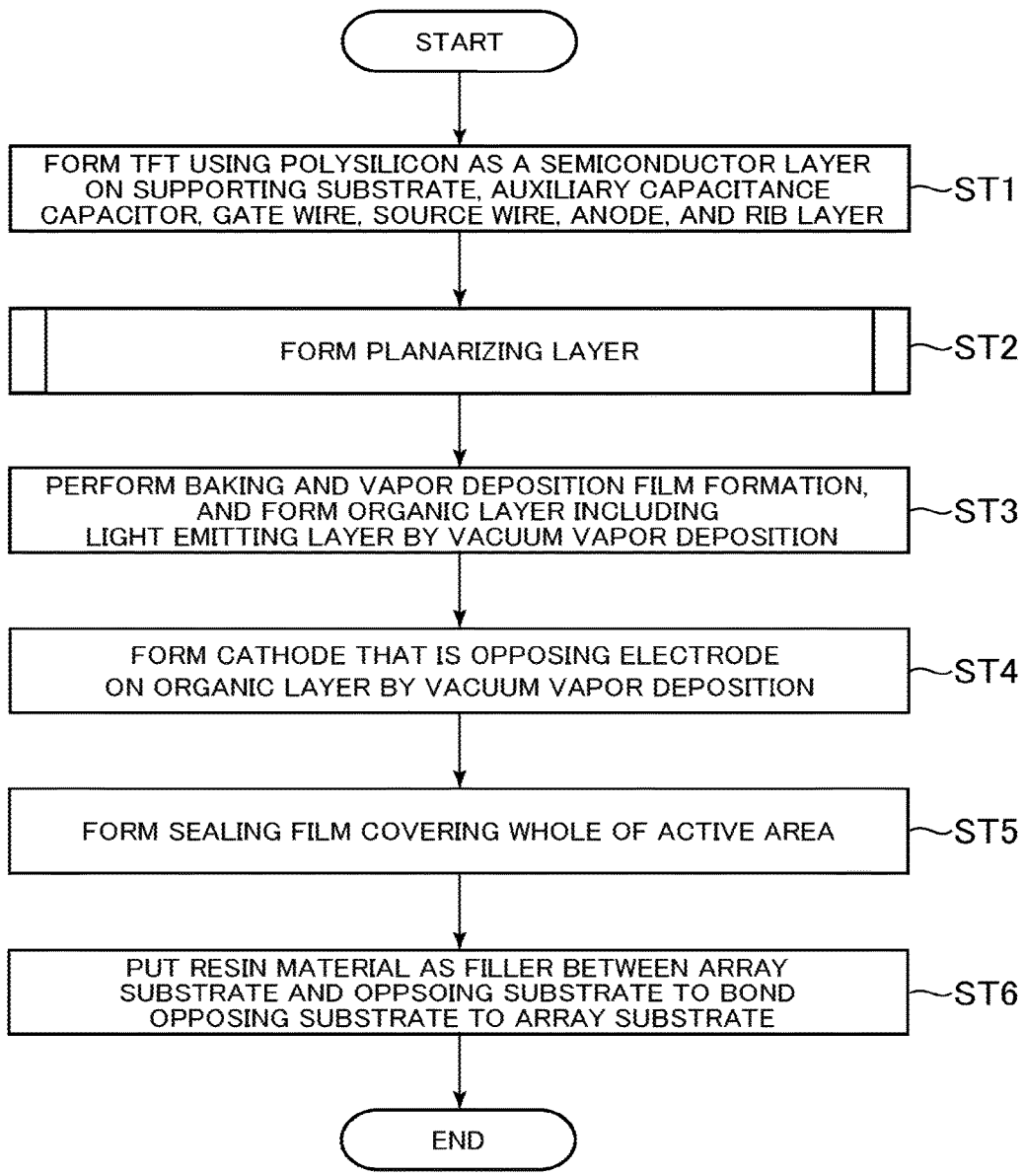
FIG. 3 is a flowchart illustrating a manufacturing method of the organic EL display device according to the embodiment of the present invention.

Below, a manufacturing method of the organic EL display device according to the embodiment of the present invention is explained. FIG. 3 is a flowchart illustrating a manufacturing method of the organic EL display device according to the embodiment of the present invention.

In ST1, film forming and patterning of a conducting material or an insulating material on the supporting substrate 10 are repeated, and the switching element 11 including a thin film transistor that uses, for example, polysilicon as a semiconductor layer, the auxiliary capacitance capacitor C, the gate wire, the data wire, the anode 12 (the pixel electrode), and the rib layer LIB are formed.

Subsequently, in ST2, the planarizing layer AG is formed partially or intermittently on the anode 12 and on the rib layer LIB. A detail of a formation of the planarizing layer AG will be described later.

Subsequently, in ST3, baking and vapor deposition film forming are performed, and the organic layer 13 that includes the light emitting layer is formed by a vacuum vapor deposition. At this time, between the formation of the planarizing layer AG and the formation of the organic layer 13, it is preferable that the process chamber is not opened to an outer atmosphere, and is connected to a vacuum device or kept under an N2 atmosphere whose concentration of moisture is 1 ppm or less or a CDA (clean dry air) environment.

Subsequently, in ST4, the cathode 14 that is the opposing electrode is formed on the organic layer 13 by a vacuum vapor deposition.

Subsequently, in ST5, the sealing film LS is formed so as to cover the whole of the active area ACT to protect the organic layer 13 from moisture.

Subsequently, in ST6, the opposing substrate CT is bonded thereto with an interposition of a resin material as the filler 20. In this way, the organic EL display device of this embodiment is obtained.

Below, a formation process of the planarizing layer AG (ST2) is explained. FIG. 4 is a diagram illustrating respective processes included in the formation process of the planarizing layer AG.

Figure 4A:
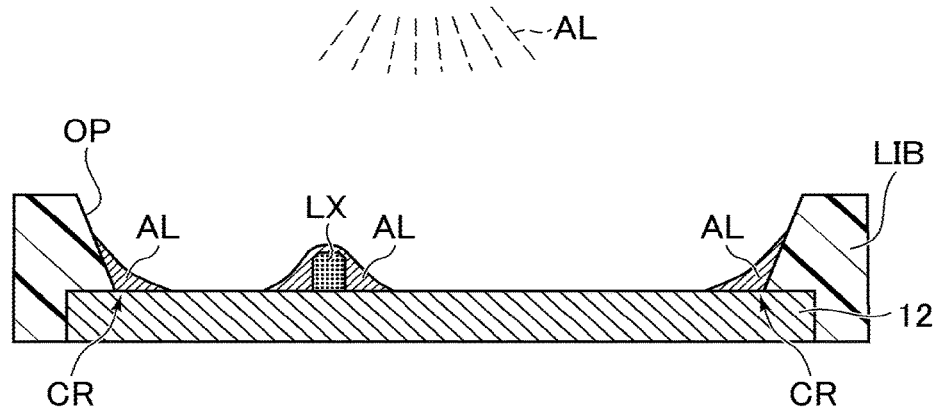
FIGS. 4A to 4C are diagrams illustrating respective processes included in a formation process of a planarizing layer.

Firstly, in a process illustrated in FIG. 4A, solvent AL including an organic material is sprayed. Specifically, the solvent AL that is a mixture of polymer resin and a polymerization initiator is sprayed as a mist onto the substrate under a vacuum environment. The solvent AL sprayed onto the surface of the anode 12 and the side wall forming the opening OP is aggregated by a surface tension to the corner CR formed by the inner wall forming the opening OP and the anode 12 and around the foreign object LX and is attached thereto. Meanwhile, the solvent AL is hardly attached to a horizontal area that is distant from the corner CR and the foreign object LX.

At this time, supply conditions of the solvent AL (a supply time, a substrate temperature, a film formation atmosphere, and the like) are adjusted, so that the solvent AL does not form a continuous film. For example, a supply amount of the solvent AL is reduced so that a layer is formed whose height is less than about one fifth of that of the rib layer LIB of the case where the planarizing layer AG is formed in a horizontal area, and is adjusted so that the film is intermittently formed.

Figure 4B:
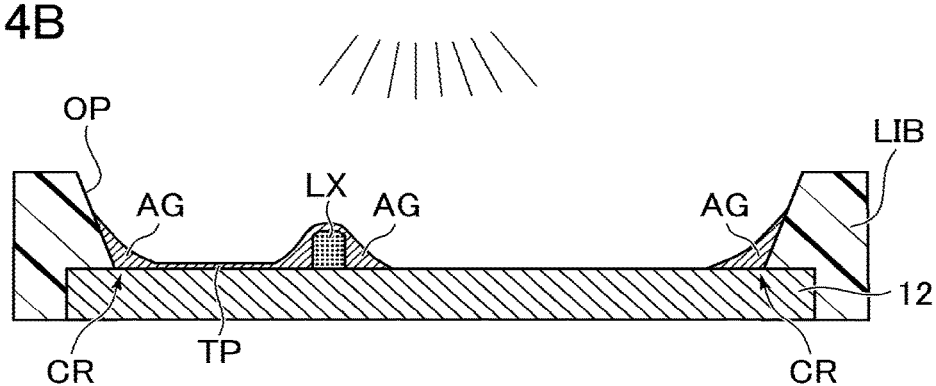

Subsequently, in the process illustrated in FIG. 4B, the attached solvent AL is cured. Specifically, by irradiating ultraviolet light onto the attached solvent AL, the solvent AL attached to an area around the corner CR formed by the inner wall forming the opening OP and the anode 12 and to an area around the foreign object LX is cured, and the planarizing layer AG is obtained.

Figure 4C:
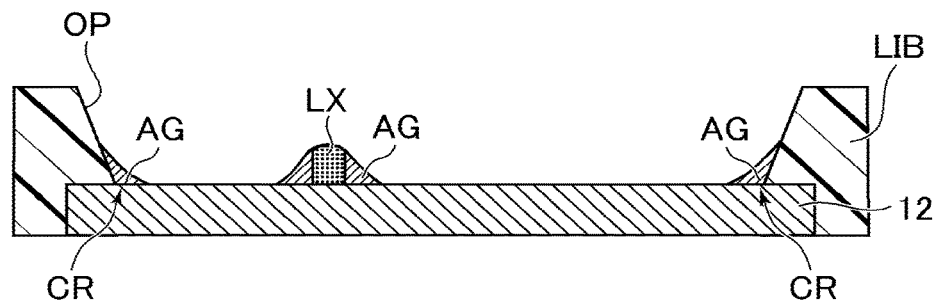

Subsequently, in the process illustrated in FIG. 4C, a part of the cured solvent AG is removed. This process is arbitrary. Depending on the supply conditions of the solvent AL, a thin film part TP of the cured solvent AL (the planarizing layer AG) may be formed also in a horizontal area as illustrated in FIG. 4B. In such a case, it is preferable to perform the etching so that only the thin film part TP is removed.

By forming the organic EL display device as seen above, the breakage of the organic layer 13 due to a curvature near the intersection of the inclined surface of the rib layer LIB and the horizontal surface of the anode 12 and due to the foreign object LX on the anode 12 can be prevented. As a result thereof, it becomes possible to prevent a generation of a pixel defect due to short-circuiting of the anode 12 and the cathode 14. That is, according to this embodiment, the organic EL display device and the manufacturing method of the organic EL display device with high yield can be provided.

Figure 5:
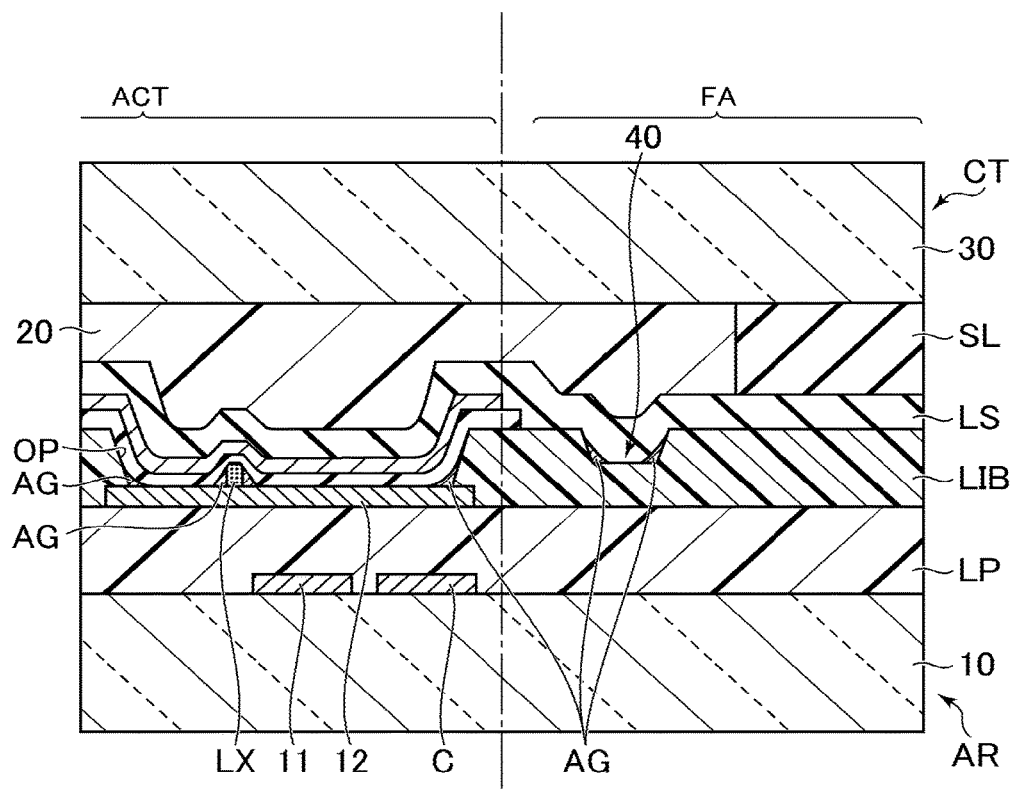
FIG. 5 is a cross sectional view schematically illustrating a structure of a frame area of the organic EL display device.

FIG. 5 is a cross sectional view schematically illustrating a structure of a frame area FA of the organic EL display device of this embodiment.

Further, in this embodiment, in the frame area FA around the active area ACT, a recessed part 40 may be formed in the rib layer LIB as the surface shape before the planarizing layer AG is formed. The recessed part 40 is, as illustrated in FIG. 1, formed between the active area ACT and the sealing member SL so as to surround the active area ACT. The configuration is not limited to the above, and the recessed part 40 may be arranged at a position opposed to the sealing member SL, and may be arranged at a position located outside the sealing member SL. L/S that indicates the resolution of the recessed part 40 is preferably, for example, between 10 µm and 100 µm, and is more preferably between 20 µm and 50 µm. The depth of the recessed part 40 is preferably, for example, between 1 µm and 10 µm.

If the recessed part 40 that surrounds the active area ACT like this is provided, the planarizing layer AG is aggregated at a corner formed by an inner wall and the bottom surface of the recessed part 40 and is formed there, but is not formed at a horizontal area at the center of the recessed part 40. Thus, a gap is formed in the planarizing layer AG at the recessed part 40. Therefore, the planarizing layer AG has a discontinuity at the recessed part 40 between the side of the active area ACT and the outer environment side, and an infiltration and a dispersion of moisture in the active area ACT via the planarizing layer AG can be avoided. Further, since there is no necessity to form a discontinuous planarizing layer using a mask, a reduction of equipment costs and operational costs can be realized, and at the same time a narrowing down of the frame of the display device can be realized as well.

Figure 6:
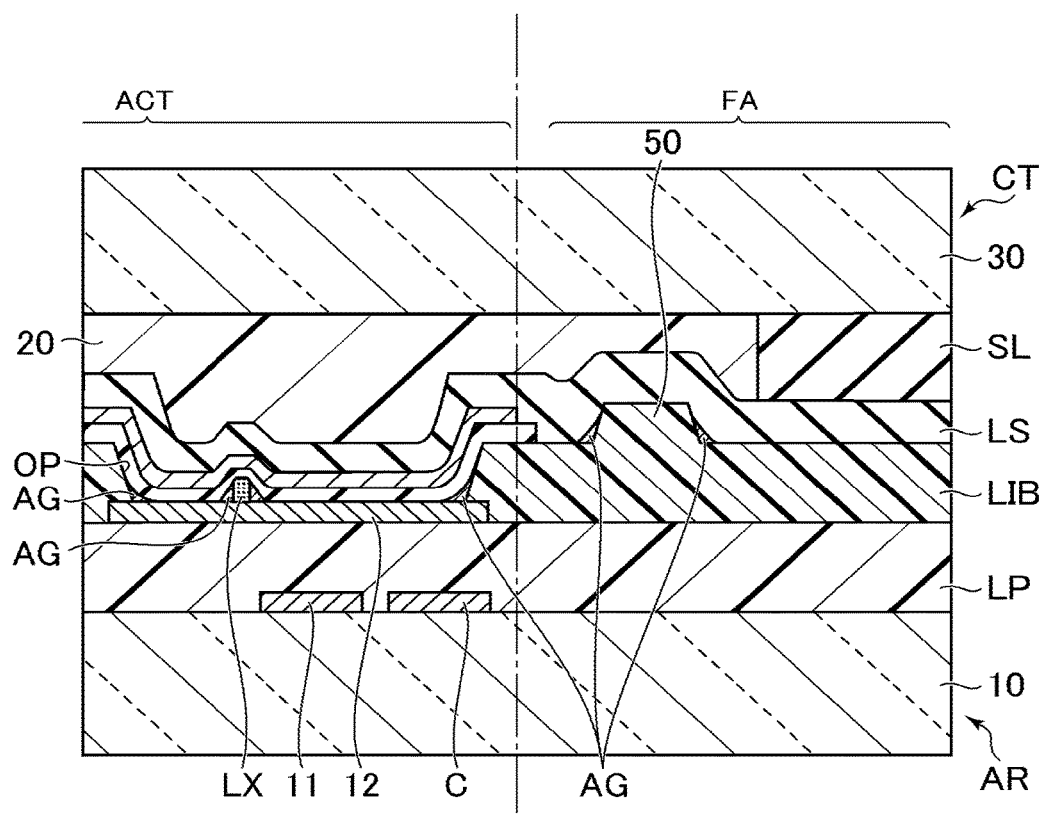
FIG. 6 is a cross sectional view schematically illustrating the structure of the frame area of the organic EL display device.

FIG. 6 is a cross sectional view schematically illustrating the structure of the frame area FA of the organic EL display device of this embodiment.

Further, in this embodiment, in the frame area FA around the active area ACT, a projected part 50 may be formed in the rib layer LIB as the surface shape before the planarizing layer AG is formed. The projected part 50 is, as illustrated in FIG. 1, formed between the active area ACT and the sealing member SL so as to surround the active area ACT. The configuration is not limited to the above, and the projected part 50 may be arranged at a position opposed to the sealing member SL, and may be arranged at a position outside the sealing member SL. L/S that indicates the resolution of the projected part 50 is preferably, for example, between 10 µm and 100 µm, and the height of the projected part 50 is preferably, for example, between 1 µm and 10 µm.

If the projected part 50 that surrounds the active area ACT like this is provided, the planarizing layer AG is aggregated at a corner formed by an outer wall of the projected part 50 and an upper surface of a surrounding area around it and is formed there, but is not formed at a horizontal area on the top surface of the projected part 50. Thus, a gap is formed in the planarizing layer AG at the projected part 50. Therefore, the active area ACT side and the outer environment side of the planarizing layer AG are discontinuous at the projected part 50, and an infiltration of moisture in the active area ACT and its dispersion via the planarizing layer AG can be avoided. Further, since there is no necessity to form a discontinuous planarizing layer using a mask, a reduction of equipment costs and operational costs can be realized, and at the same time a narrowing down of the frame of the display device can be realized as well.

In the example illustrated in FIGS. 4 and 5, a number of patterns of the recessed part 40 and the projected part 50 surrounding the entire periphery is at least one, but the same effect can be expected even when it is increased to two or more. For example, in the periphery of the active area ACT, a pattern of the recessed part 40 or the projected part 50 may be further provided at a position opposed to the sealing member SL, and a pattern of the recessed part 40 or the projected part 50 may be further provided at a position whose distance to the outer environment is shorter than that to the sealing member SL. By providing at least one pattern of the recessed part 40 or the projected part 50 around the active area ACT, the above effect can be obtained.

Those skilled in the art should be able to arrive at various kinds of variations and modifications within the spirit of the present invention, ant it is understood that such variations and modifications are within the scope of the present invention. For example, addition, deletion, or design change of components, or addition, omission, or condition change of processes made by those skilled in each embodiment described above as appropriate are also encompassed within the scope of the present invention as long as they fall within the spirit of the present invention.

What is claimed is:

1. An organic EL display device comprising:
   a pixel electrode;
   a pixel isolation insulating film on which an opening at a bottom of which the pixel electrode is exposed is formed;
   an aggregate of an insulative organic material partially formed on the pixel electrode that is exposed at the bottom of the opening;
   an organic film, including a light emitting layer, that covers the pixel electrode and the aggregate, the organic film including at least one of a hole injection layer or a hole transport layer; and
   an opposing electrode that covers the organic film;
   wherein the aggregate is formed at a corner formed by the pixel electrode that is exposed at the bottom of the opening and an inner wall that forms the opening of the pixel isolation insulating film, the aggregate being formed of a material different from the organic film.

2. The organic EL display device according to claim 1, wherein the aggregate is formed at a corner formed by the pixel electrode that is exposed at the bottom of the opening and a particle that exists on the pixel electrode.

3. The organic EL display device according to claim 1, wherein a recessed part or a projected part is foil led on a frame area, which is located outside a display region on which the pixel electrode is arranged, of the pixel isolation insulating film.

* * * * *